(12) United States Patent
Masumoto

(10) Patent No.: US 8,571,081 B2
(45) Date of Patent: Oct. 29, 2013

(54) SEMICONDUCTOR LIGHT-EMITTING DEVICE

(75) Inventor: Ichiro Masumoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/473,714

(22) Filed: May 17, 2012

(65) Prior Publication Data

US 2012/0300805 A1  Nov. 29, 2012

(30) Foreign Application Priority Data

May 24, 2011  (JP) ................................. 2011-115623

(51) Int. Cl.
  *H01S 5/00* (2006.01)
(52) U.S. Cl.
  USPC .................................... 372/45.012; 372/46.01
(58) Field of Classification Search
  USPC .................................................... 372/45.012
  See application file for complete search history.

(56) References Cited

U.S. PATENT DOCUMENTS

| 6,323,507 B1* | 11/2001 | Yokoyama et al. | ............. 257/79 |
| 2002/0054617 A1* | 5/2002 | Tsuda et al. | ..................... 372/46 |
| 2003/0042496 A1* | 3/2003 | Sasaoka | ........................ 257/102 |
| 2004/0264533 A1* | 12/2004 | Matsumura et al. | ............ 372/45 |
| 2006/0268952 A1* | 11/2006 | Watatani et al. | ........... 372/43.01 |

FOREIGN PATENT DOCUMENTS

| JP | 7-22690 | 1/1995 |
| JP | 2001-68786 | 3/2001 |
| JP | 2003-78215 | 3/2003 |
| JP | 2008-135785 | 6/2008 |

\* cited by examiner

*Primary Examiner* — Xinning Niu

(74) *Attorney, Agent, or Firm* — Young & Thompson

(57) ABSTRACT

A first cladding layer is formed above a substrate. An active layer is formed above the first cladding layer. An optical confinement layer is formed above the active layer. A pair of band-like current block layers is formed above the optical confinement layer and opposed to each other through an opening extending in a first direction. A second cladding layer is formed on the current block layers and the optical confinement layer. A contact layer is formed above the second cladding layer. A mesa portion is formed by being sandwiched between a pair of groove portions. The current block layers and the opening are included in the mesa portion, and an end of each current block layer on an opposite side to the opening and a side wall of the mesa portion are spaced apart by a predetermined value or more in a second direction.

20 Claims, 7 Drawing Sheets

SEMICONDUCTOR LIGHT-EMITTING DEVICE

CROSS-REFERENCE TO RELATED APPLICATIONS

This application is based upon and claims the benefit of priority from Japanese patent application No. 2011-115623, filed on May 24, 2011, the disclosure of which is incorporated herein in its entirety by reference.

BACKGROUND

The present invention relates to a semiconductor light-emitting device, and more particularly, to a semiconductor light-emitting device that suppresses characteristic deterioration.

Semiconductor light-emitting devices such as light emitting diodes (LEDs) and semiconductor laser diodes (LDs) are incorporated and used in various devices. The use of nitride semiconductor light-emitting devices having excellent characteristics has advanced in recent years. As an example of such nitride semiconductor light-emitting devices, an inner stripe type nitride semiconductor laser diode having a current block layer made of AlN is proposed (Japanese Unexamined Patent Application Publication No. 2003-78215).

A semiconductor laser 300 serving as an inner stripe type nitride semiconductor laser diode disclosed in Japanese Unexamined Patent Application Publication No. 2003-78215 will be described below. FIG. 7 is a sectional view schematically showing the configuration of the semiconductor laser 300 serving as the inner stripe type nitride semiconductor laser diode disclosed in Japanese Unexamined Patent Application Publication No. 2003-78215.

The semiconductor laser 300 has a configuration in which an Si-doped n-type GaN layer 302 (Si concentration: $4 \times 19^{17}$ cm$^{-3}$; thickness: 1 μm), an n-type cladding layer 303, an n-type optical confinement layer 304, a 3-period multiple quantum well (MQW) layer 305, a cap layer 306, and a p-type GaN guide layer 307 are stacked on an n-type GaN substrate 301. The n-type cladding layer 303 is made of Si-doped n-type $Al_{0.1}Ga_{0.9}N$ (Si concentration: $4 \times 10^{17}$ cm$^3$; thickness: 2 μm). The n-type optical confinement layer 304 is made of Si-doped n-type GaN (Si concentration: $4 \times 10^{17}$ cm$^{-3}$; thickness 0.1 μm). The 3-period multiple quantum well (MQW) layer 305 is composed of an $In_{0.15}Ga_{0.85}N$ (thickness: 3 nm) well layer and an Si-doped $In_{0.01}Ga_{0.99}N$ (Si concentration: $1 \times 10^{18}$ cm$^{-3}$, thickness: 4 nm) barrier layer. The cap layer 306 is made of Mg-doped p-type $Al_{0.2}Ga_{0.8}N$. The p-type GaN guide layer 307 is made of Mg-doped p-type GaN (Mg concentration: $2 \times 10^{19}$ cm$^{-3}$; thickness: 0.1 μm).

A current constriction layer 308, a p-type cladding layer 309, and a contact layer 310 are stacked on the p-type GaN guide layer 307. The current constriction layer 308 corresponds to the above-mentioned current block layer. The p-type cladding layer 309 is made of Mg-doped p-type $Al_{0.1}Ga_{0.9}N$ (Mg concentration: $1 \times 10^{19}$ cm$^{-3}$; thickness 0.5 μm). The contact layer 310 is made of Mg-doped p-type GaN (Mg concentration: $1 \times 10^{20}$ cm$^{-3}$; thickness: 0.02 μm). A p-type electrode 311 is formed on the upper surface of the contact layer 310, and an n-type electrode 312 is formed on the lower surface of the n-type GaN substrate 301.

The current constriction layer 308 has an opening 308a. The p-type GaN guide layer 307 and the p-type cladding layer 309 contact each other via the opening 308a. In the semiconductor laser 300, a contact width between the p-type electrode 311 and the contact layer 310 can be set to be greater than the width of the opening 308a. Therefore, even when the opening 308a has a narrow width of about 1 to 2 um for allowing a horizontal mode control, a low contact resistance is obtained. As a result, a semiconductor laser having a low device resistance can be achieved.

The opening 308a is formed by performing wet etching on the current constriction layer 308 which is an AlN layer grown at a low temperature. This provides an advantage that damage or impurity contamination caused during formation of the opening 308a has less adverse effect. Accordingly, the semiconductor laser 300 is expected as a high-output semiconductor laser with low-voltage operation.

Further, a technique for facilitating device isolation of a nitride semiconductor device is proposed (Japanese Unexamined Patent Application Publication No. 2008-135785). In this technique, after formation of groove portions in a semiconductor wafer on which a nitride semiconductor is formed, break lines are formed by a laser scriber within the groove portions, and the wafer is divided into nitride semiconductor devices along the break lines. Note that related arts are disclosed (Japanese Unexamined Patent Application Publication Nos. 2001-68786 and 07-22690).

SUMMARY

However, the present inventor has found that there is a room for improvement as described below in achieving the high-output semiconductor laser with low-voltage operation by the above-mentioned techniques. At first glance, according to the techniques disclosed in Japanese Unexamined Patent Application Publication Nos. 2003-78215 and 2008-135785, it is considered that high-output semiconductor lasers with low-voltage operation can be stably produced. In practice, however, when a wafer on which an inner stripe type semiconductor laser was formed using an AlN layer grown at a low temperature as a current block layer was divided along groove portions formed by etching, a variation in characteristics was found, as compared with the case where no groove portion was formed. That is, it has been confirmed that the oscillation threshold, the reliability, and the like of the semiconductor laser tend to deteriorate when the groove portions are formed.

Accordingly, cathodoluminescence (CL) evaluation was conducted on the semiconductor laser device with deteriorated characteristics. As a result, occurrence of a defect was found at a side wall of the groove portion. A defect extending from the side wall of the groove portion to an active layer region of a waveguide portion (opening 308a) was also found.

As a result of intensive study on the cause of the occurrence of such defects, the following occurrence mechanism has been found. That is, the AlN layer used as the current block layer has a large lattice mismatch of about 4% as compared with crystal (for example, GaN) of a foundation layer. Accordingly, it is considered that a stress is concentrated between the AlN layer and the foundation layer, so that a stress concentration region is generated. When etching is performed on the layer including the stress concentration region to form the groove portion, it is considered that a defect occurs in the stress concentration region due to physical damage caused by etching. The occurring defect extends to the active layer region of the waveguide portion (opening 308a). As a result of introducing the defect into the active layer region of the waveguide portion (opening 308a), it is considered that deterioration in LD characteristics occurs.

A first exemplary aspect of the present invention is a semiconductor light-emitting device including: a first cladding layer formed above a substrate of a first conductivity type; an active layer formed above the first cladding layer; an optical confinement layer formed above the active layer and having a second conductivity type different from the first conductivity type; a pair of band-like current block layers formed above the optical confinement layer, the current block layers being opposed to each other through an opening extending in a first direction; a second cladding layer of the second conductivity type formed on the current block layers and the optical confinement layer exposed with the current block layers not formed; and a contact layer of the second conductivity type formed above the second cladding layer. A mesa portion is formed by being sandwiched between a pair of groove portions penetrating at least the active layer from the contact layer and extending in the first direction. The current block layers and the opening are included in the mesa portion, and an end of each current block layer on an opposite side to the opening and a side wall of the mesa portion are spaced apart by a predetermined value or more in a second direction orthogonal to the first direction at an upper surface of the optical confinement layer. In the above-mentioned semiconductor light-emitting device, physical damage is applied to the side wall of the mesa portion during formation of the groove portions. However, a stress concentration region, which is generated when a stress is concentrated between each current block layer and the foundation layer, and the side wall of the mesa portion are spaced apart by a predetermined value or more, thereby making it possible to suppress occurrence of a defect. Consequently, characteristic deterioration of the semiconductor light-emitting device can be prevented.

According to an exemplary aspect of the present invention, it is possible to provide a semiconductor light-emitting device capable of preventing characteristic deterioration with a simple configuration.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
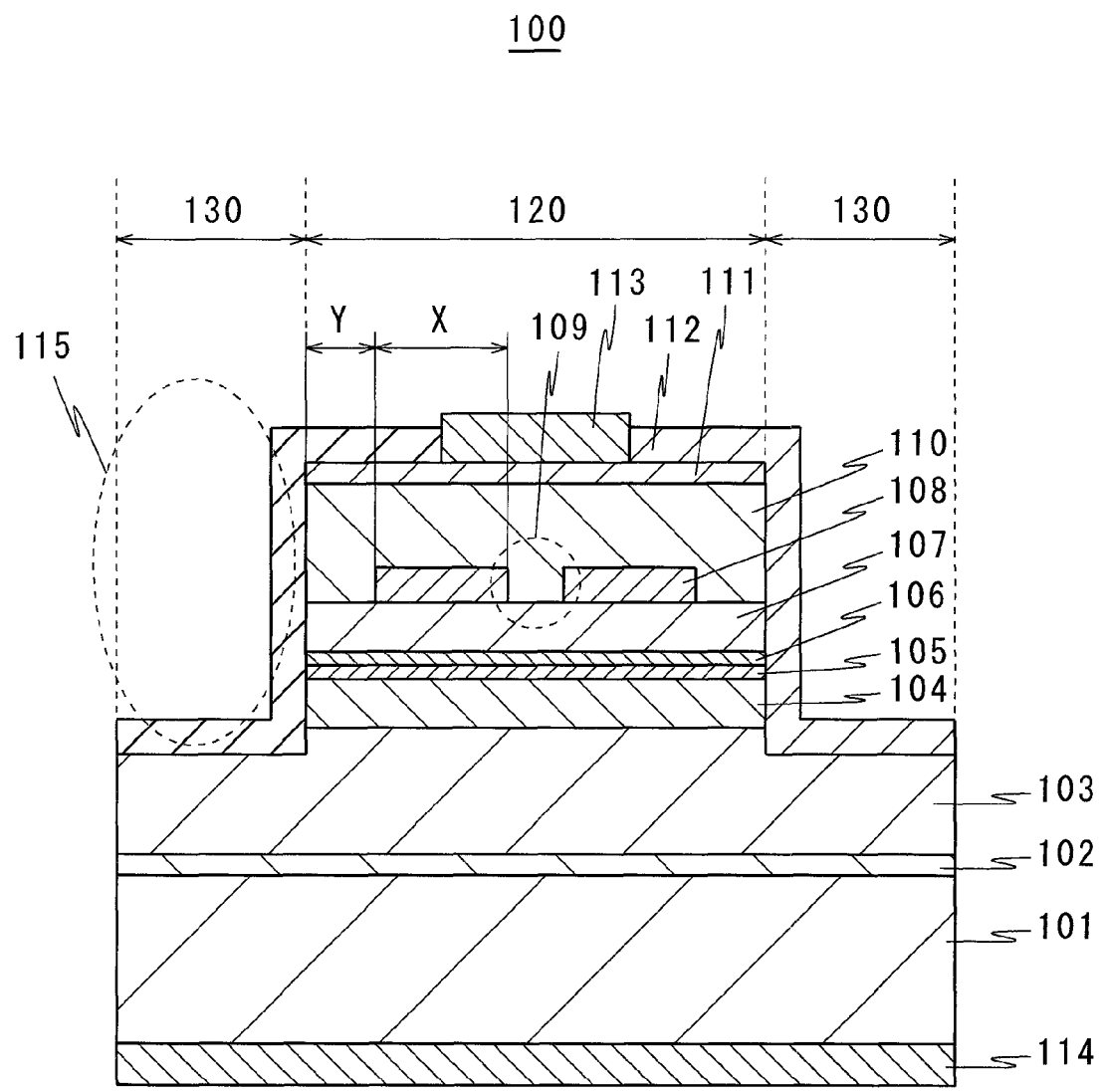
FIG. 1 is a sectional view schematically showing a configuration of a semiconductor light-emitting device 100 according to a first exemplary embodiment.

Hereinafter, exemplary embodiments of the present invention will be described with reference to the drawings. In the drawings, the same components are denoted by the same reference numerals, and a repeated explanation is omitted as needed.

First Exemplary Embodiment

First, a semiconductor light-emitting device 100 according to a first exemplary embodiment of the present invention will be described. In the first exemplary embodiment, a semiconductor laser is described as an example of the semiconductor light-emitting device. FIG. 1 is a sectional view schematically showing the configuration of the semiconductor light-emitting device 100 according to the first exemplary embodiment. The semiconductor light-emitting device 100 has a configuration in which an n-type buffer layer 102, an n-type cladding layer 103, an n-side optical confinement layer 104, an active layer 105, a cap layer 106, and a p-side optical confinement layer 107 are stacked in this order on an n-type substrate 101.

The n-type substrate 101 is formed of a GaN substrate, for example. The n-type buffer layer 102 is made of GaN having a thickness of 1 µm, for example. The n-type cladding layer 103 is made of AlGaN having a thickness of 2 µm, for example. The n-side optical confinement layer 104 is made of GaN having a thickness of 0.1 µm, for example. The active layer 105 has a multiple quantum well structure including an InGaN well layer and an InGaN barrier layer, for example. The cap layer 106 is made of AlGaN having a thickness of 10 nm, for example. The p-side optical confinement layer 107 is made of GaN having a thickness of 0.1 µm, for example.

Current block layers 108 are formed on the p-side optical confinement layer 107. Each current block layer 108 corresponds to the current constriction layer 308 of the semiconductor laser 300. The current block layers 108 have a band-like opening 109 serving as a waveguide. Thus, the current block layers 108 are formed as a pair of band-like layers each having a width of 20 µm (X=20 µm in FIG. 1). Each current block layer 108 is made of AlN having a thickness of 0.1 µm, for example, and also functions as a light distribution control layer by a refractive index difference in the horizontal direction.

Figure 2:
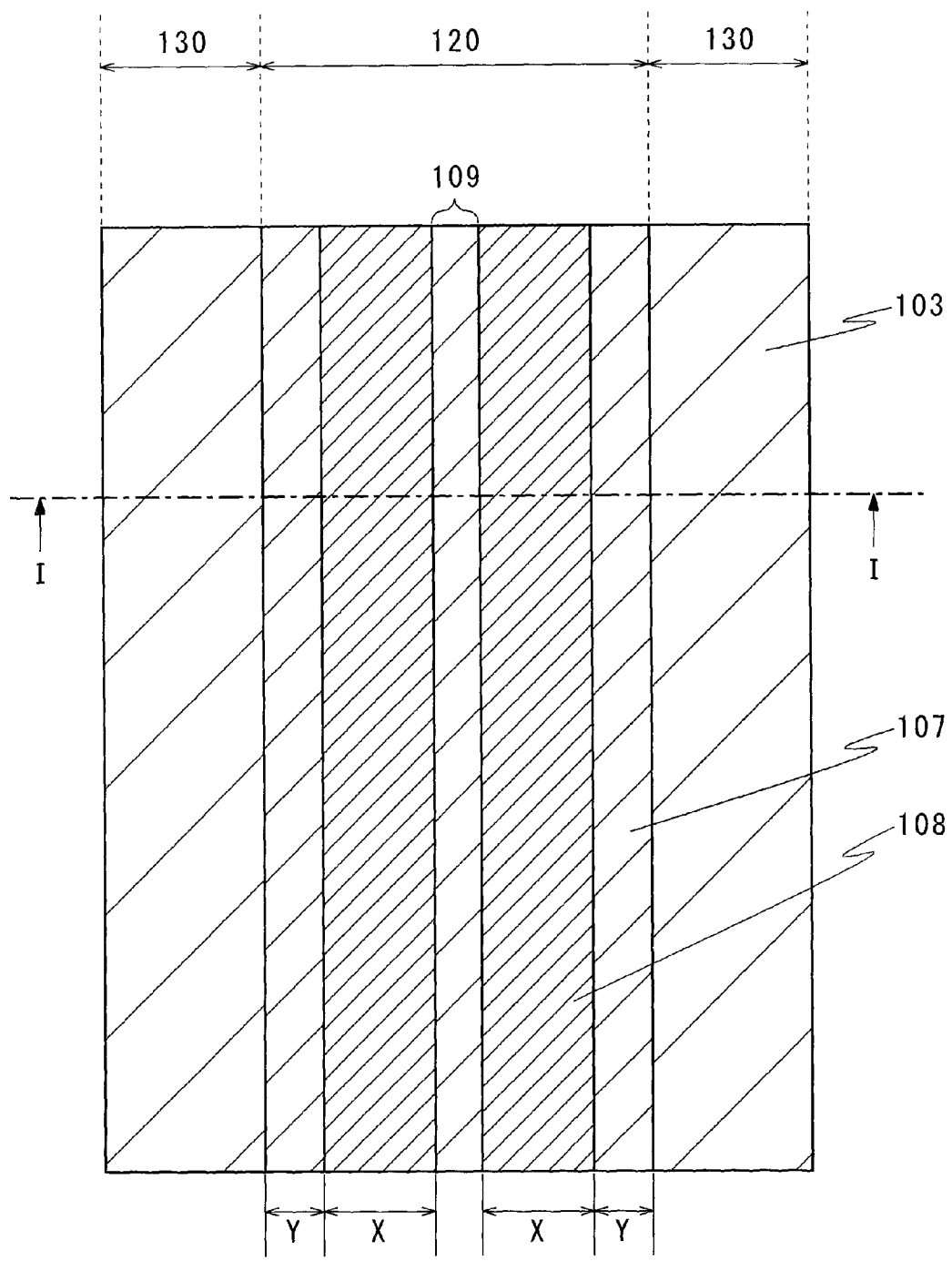
FIG. 2 is a top view schematically showing the configuration of the semiconductor light-emitting device 100 according to the first exemplary embodiment.

The term "horizontal direction" herein described refers to the horizontal direction in the plane of FIGS. 1 and 2. Hereinafter, the horizontal direction corresponds to a second direction. In the first exemplary embodiment, the longitudinal direction of each of the band-like current block layers 108 and the opening 109 corresponds to the vertical direction with respect to the plane of FIG. 1. Hereinafter, the vertical direction corresponds to a first direction. Accordingly, the first direction and the second direction are orthogonal to each other on the upper surface of the p-side optical confinement layer 107.

A p-type cladding layer 110 and a p-type contact layer 111 are stacked in this order on the current block layers 108 and the opening 109. The p-type cladding layer 110 has a 130-period superlattice structure including GaN having a thickness of 2.5 nm and AlGaN having a thickness of 2.5 nm, for example. The p-type contact layer 111 is made of GaN having a thickness of 0.1 µm, for example. Si, for example, is used as an n-type impurity, and Mg, for example, is used as a p-type impurity.

A protective film 112 having a band-like opening is formed on the upper surface of the p-type contact layer 111. The composition of the protective film 112 is, for example, $SiO_2$. The width of the opening of the protective film 112 is 20 µm. A p-type electrode 113 is formed in the opening of the protective film 112. An n-type electrode 114 is formed on the lower surface of the n-type substrate 101.

The semiconductor light-emitting device 100 is divided into a mesa portion 120 and a groove portion 130. The groove portion 130 has a groove 115 formed in the range from the p-type contact layer 111 to the n-type cladding layer 103. The groove 115 is covered with the protective film 112. The groove 115 has a depth of 1 μm from the p-type contact layer 111. A side wall of the groove 115 on the side of the mesa portion 120 is spaced apart by 20 μm from an end of each current block layer 108 on the opposite side to the opening 109 (Y=20 μm in FIG. 1). The mesa portion 120 centered on the position of the opening 109 is formed by being sandwiched between a pair of grooves 115 (that is, groove portions 130).

FIG. 2 is a top view schematically showing the configuration of the semiconductor light-emitting device 100 according to the first exemplary embodiment. Note that FIG. 1 is a sectional view taken along the line I-I of FIG. 2. To facilitate explanation of the relation between X and Y in FIG. 1, the p-type cladding layer 110, the p-type contact layer 111, the protective film 112, and the p-type electrode 113 are omitted in FIG. 2. As shown in FIG. 2, the current block layers 108 and the opening 109 are each formed in a band shape extending in the vertical direction in the plane of FIG. 2, that is, in the first direction.

Subsequently, a method for manufacturing the semiconductor light-emitting device 100 will be described. To form a layer made of semiconductor, a low-pressure MOVPE apparatus having a pressure of 300 hPa is used. A mixed gas of hydrogen and nitrogen is used as a carrier gas. Trimethylgallium (TMG), trimethylaluminium (TMA), and trimethylindium (TMI) are used as a Ga source, an Al source, and an In source, respectively. Silane ($SiH_4$) is used as an Si source which is an n-type impurity, and bis(cyclopentadienyl)magnesium is used as an Mg source which is a p-type impurity.

After the n-type substrate 101 is input into the low-pressure MOVPE apparatus, the temperature of the n-type substrate 101 is increased while ammonia is supplied. When the temperature reaches a growth temperature, a first crystal growth is started. First, the n-type buffer layer 102, the n-type cladding layer 103, the n-side optical confinement layer 104, the active layer 105, the cap layer 106, the p-side optical confinement layer 107, and the current block layers 108 are allowed to grow in this order. In this case, the growth temperature of each of the n-type buffer layer 102, the n-type cladding layer 103, the n-side optical confinement layer 104, the cap layer 106, and the p-side optical confinement layer 107 is 1100° C., for example. The growth temperature of the active layer 105 is 800° C., for example. The growth temperature of each current block layer 108 is 200 to 800° C., for example.

That is, the current block layers 108 are grown at a temperature lower than that for the other layers, at the end of the first crystal growth. Accordingly, when the first crystal growth is finished, the current block layers 108 are formed as an amorphous low temperature growth AlN layer.

Next, the band-like opening 109 is formed between the current block layers 108 (low temperature growth AlN layer). An $SiO_2$ film is first stacked with a thickness of 100 nm on the current block layers 108 (low temperature growth AlN layer). Then, a resist is applied to the $SiO_2$ film, and a band-like pattern having a width of 2 μm is then formed on the resist by photolithography.

The $SiO_2$ film is etched with the resist as a mask by using buffered hydrofluoric acid, for example. After that, the resist is removed using an organic solvent, and rinsing is carried out. After the resist is removed, the current block layers 108 (low temperature growth AlN layer) are etched with the $SiO_2$ film as a mask. A mixed solution of phosphoric acid and sulfuric acid at a volume ratio of 1:1, for example, is used as an etchant. The current block layers 108 (low temperature growth AlN layer) formed in a region which is not covered with the $SiO_2$ film are removed by etching for 10 minutes by using the above-mentioned etchant held at 80° C., thereby obtaining the band-like opening 109. After that, the $SiO_2$ film used as a mask is removed using buffered hydrofluoric acid, for example. As a result, the band-like opening 109 having a width of 2 μm can be formed between the current block layers 108 (low temperature growth AlN layer). Hereinafter, unless otherwise specified, the n-type substrate 101 obtained in the process of producing the semiconductor light-emitting device 100 and the structure formed thereon are referred to as a sample.

After formation of the opening 109, the sample is input into the low-pressure MOVPE apparatus, and the temperature of the sample is then increased while ammonia is supplied. When the temperature reaches a growth temperature, a second crystal growth (embedding regrowth) is started. In this case, in the process of temperature rise, single crystallization of the low temperature growth AlN layer forming each current block layer 108 is progressed. Then, the p-type cladding layer 110 and the p-type contact layer 111 are sequentially formed on the current block layers 108 and the opening 109. By this embedding regrowth, the stripe-like opening 109 is buried with the p-type cladding layer 110 and the p-type contact layer 111.

Next, a device process for producing the device structure of the semiconductor light-emitting device 100 is carried out. First, each groove 115 is formed. Specifically, an $SiO_2$ film is deposited on the p-type contact layer 111. Then, a resist is applied to the $SiO_2$ film, and a resist pattern for forming the groove 115 is formed by photolithography. After that, an $SiO_2$ mask having a desired pattern is formed by etching using the resist pattern as an etching mask. Then, dry etching using the $SiO_2$ mask is performed, for example, to thereby form the groove 115 each having a depth of 1 μm. That is, the bottom of each groove 115 is positioned within the n-type cladding layer 103. As a result, the mesa portion 120 and the groove portion 130 are formed.

After the $SiO_2$ mask is removed, the protective film 112 is deposited on each of the mesa portion 120 and the groove portion 130. A resist is applied to the protective film 112, and pattern formation and etching are carried out by photolithography, thereby forming the band-like opening in the protective film 112. Further, by a well-known method, the p-type electrode 113 is formed in the opening of the protective film 112. The n-type electrode 114 is formed on the lower surface of the n-type substrate 101.

After that, the adjacent semiconductor light-emitting devices 100 are separated at the groove portions 130, thereby producing the semiconductor light-emitting device 100 according to this exemplary embodiment.

The provision of the groove portions 130 enables the semiconductor light-emitting device 100 to suppress generation of a device in which an isolation failure occurs during device isolation. The distance between a side wall of each groove 115 on the side of the mesa portion 120 and each current block layer 108 is 20 μm. This prevents a defect from occurring at the side wall of the mesa portion 120 and extending to the active layer 105 in the vicinity of the opening 109 during formation of the groove 115 by etching. Note that physical damage is liable to occur when the groove 115 is formed by dry etching such as plasma RIE (Reactive Ion Etching). Accordingly, it is especially effective to isolate the side wall of the groove 115 on the side of the mesa portion 120 from the current block layer 108 so as to suppress occurrence of a defect. As a result, deterioration in laser characteristics can be prevented as compared with the normal semiconductor light-emitting device.

Figure 3:
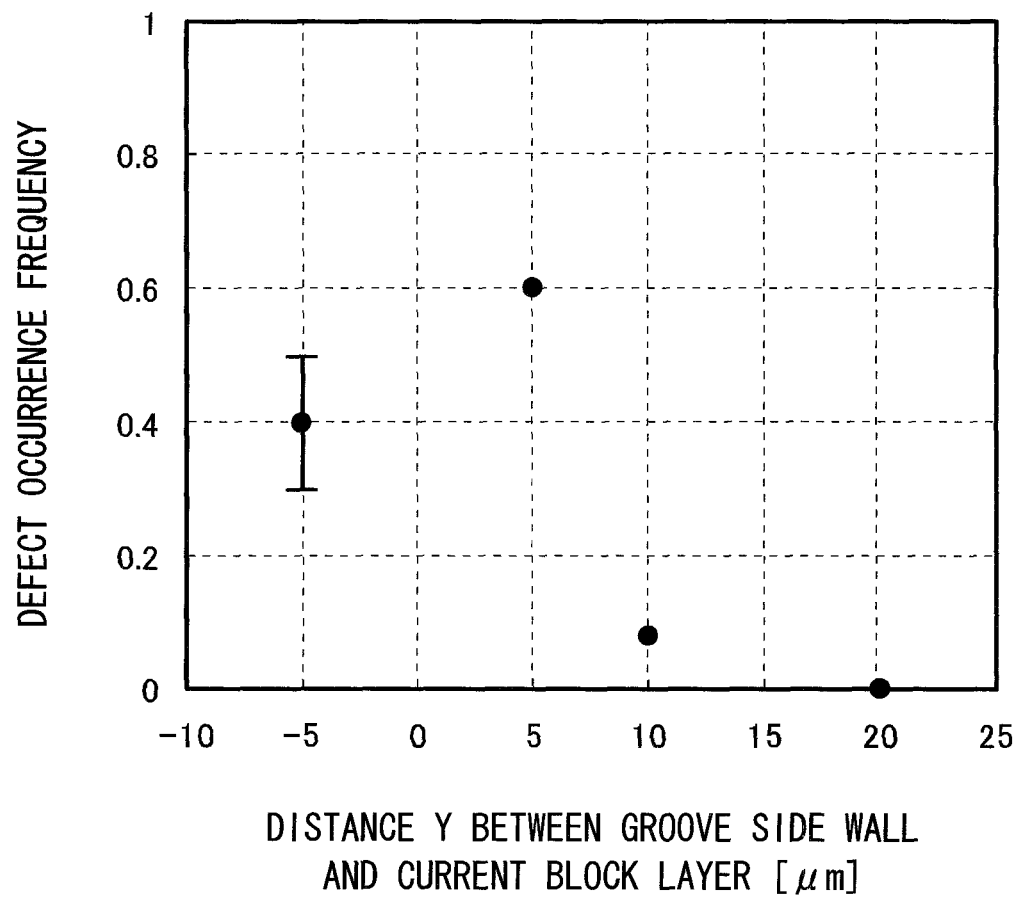
FIG. 3 is a graph showing a relation between a distance Y between a groove 115 and a current block layer 108 and a defect occurrence frequency in an active layer 105 in the vicinity of an opening 109 which is evaluated by cathodoluminescence (hereinafter CL) measurement.

Subsequently, the technical meaning of the distance between each groove 115 and each current block layer 108 will be described. FIG. 3 is a graph showing a relation between a distance Y between each groove 115 and each current block layer 108 and the frequency of occurrence of defects occurring at the side wall of the mesa portion 120 and extending to the active layer 105 in the vicinity of the opening 109, which is evaluated by cathodoluminescence (hereinafter CL) measurement. Note that in FIG. 3, an error bar is indicated at a measurement point of Y=−5 µm. This CL measurement assumes an error of ±0.1.

As shown in FIG. 3, also in the configuration in which each groove 115 and each current block layer 108 are not in contact with each other, when the distance therebetween is small (Y=5 µm), a defect occurring at the side wall of the mesa portion 120 and extending to the active layer 105 in the vicinity of the opening 109 is found. When the distance between the groove 115 and the current block layer 108 is sufficiently large (Y=20 µm), a defect occurring at the side wall of the mesa portion 120 and extending to the active layer 105 in the vicinity of the opening 109 is not found.

Figure 4:
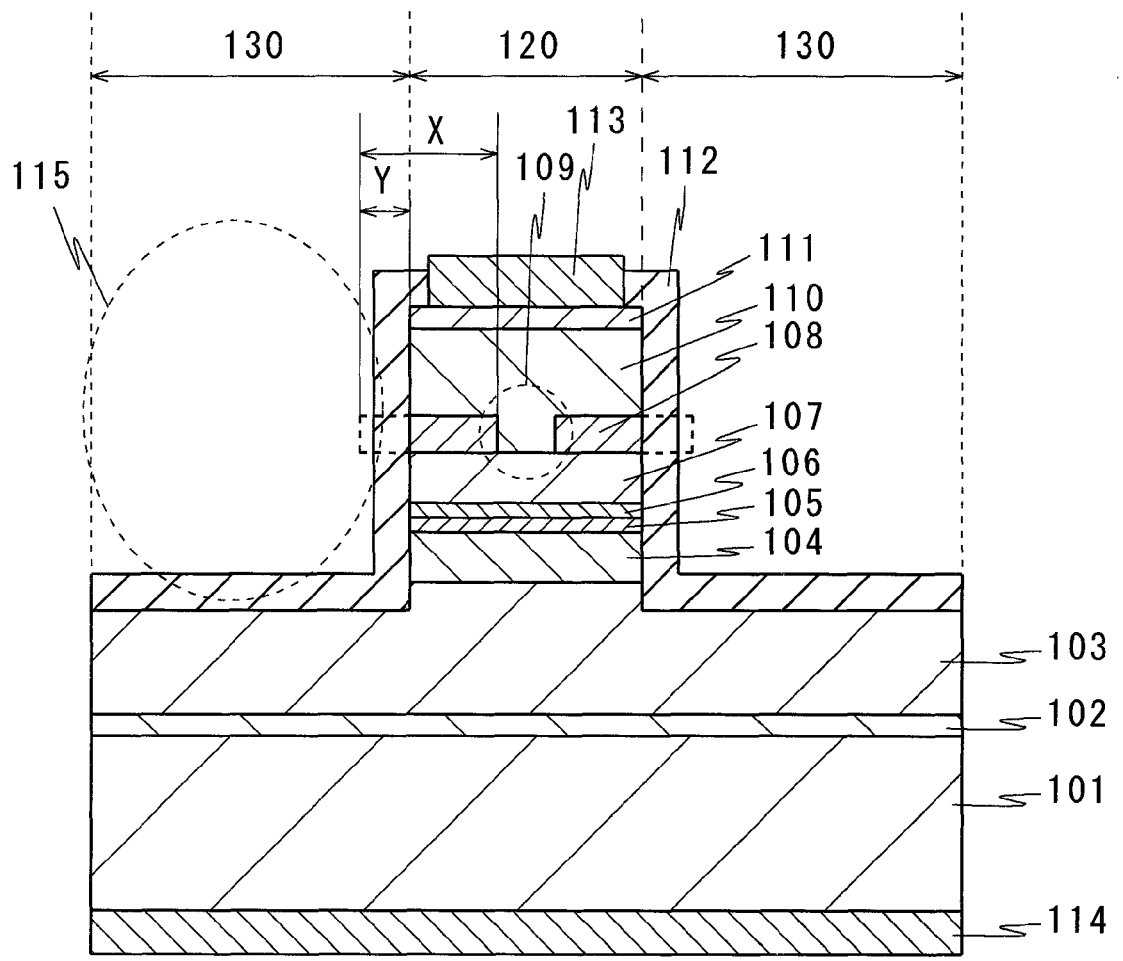
FIG. 4 is a sectional view schematically showing the configuration of the semiconductor light-emitting device when Y<0.

When Y=−5 µm, considering the range of the error bar, occurrence of defects at the same level as the case of Y=5 µm can be found. The case of Y<0 indicates the case where the region where the current block layer 108 is originally present overlaps the groove 115. FIG. 4 is a sectional view schematically showing the configuration of the semiconductor light-emitting device when Y<0. As shown in FIG. 4, the case of Y<0 indicates the case where an end of each current block layer 108 on the opposite side to the opening 109 is removed by the groove 115.

In view of the above, it turns out that the effect of suppressing a defect is obtained in the semiconductor light-emitting device 100 when Y≥10 µm. Therefore, in the semiconductor light-emitting device 100, the occurrence of a defect can be favorably prevented by spacing the end of each current block layer 108 on the opposite side to the opening 109 by 10 µm or more from the side wall of the mesa portion 120.

When Y≥20 µm, it turns out that the defect occurring at the side wall of the mesa portion 120 and extending to the active layer 105 in the vicinity of the opening 109 can be substantially eliminated. Accordingly, in the semiconductor light-emitting device 100, the occurrence of a defect can be favorably prevented by spacing the end of each current block layer 108 on the opposite side to the opening 109 by 20 µm or more from the side wall of the mesa portion 120.

In the first exemplary embodiment, the groove 115 has a depth of 1 µm from the p-type contact layer 111. This is because if the depth of the groove 115 is excessively large, the risk of introducing a defect is increased due to etching damage caused during formation of the groove 115. Furthermore, an excessively large depth of the groove 115 is not preferable in terms of the time required for forming the groove 115. Meanwhile, if the depth of the groove 115 is extremely small, the groove portion 130 and the active layer 105 in the vicinity of the opening 109 within the mesa portion 120 are continuously formed, which causes introduction of a defect during device isolation and increase in leak current during operation. Therefore, it is necessary that the groove 115 penetrate at least the active layer 105. That is, there is a desirable range of the depth of the groove 115. In this case, the bottom portion of the groove 115 is preferably positioned at the n-type cladding layer 103 in terms of the production accuracy and the like.

According to this configuration, as described above, the configuration of the semiconductor light-emitting device itself can suppress occurrence of a defect without adding any new process. Therefore, according to this configuration, it is possible to provide a semiconductor light-emitting device capable of preventing characteristic deterioration with a simple configuration.

Second Exemplary Embodiment

Figure 5:
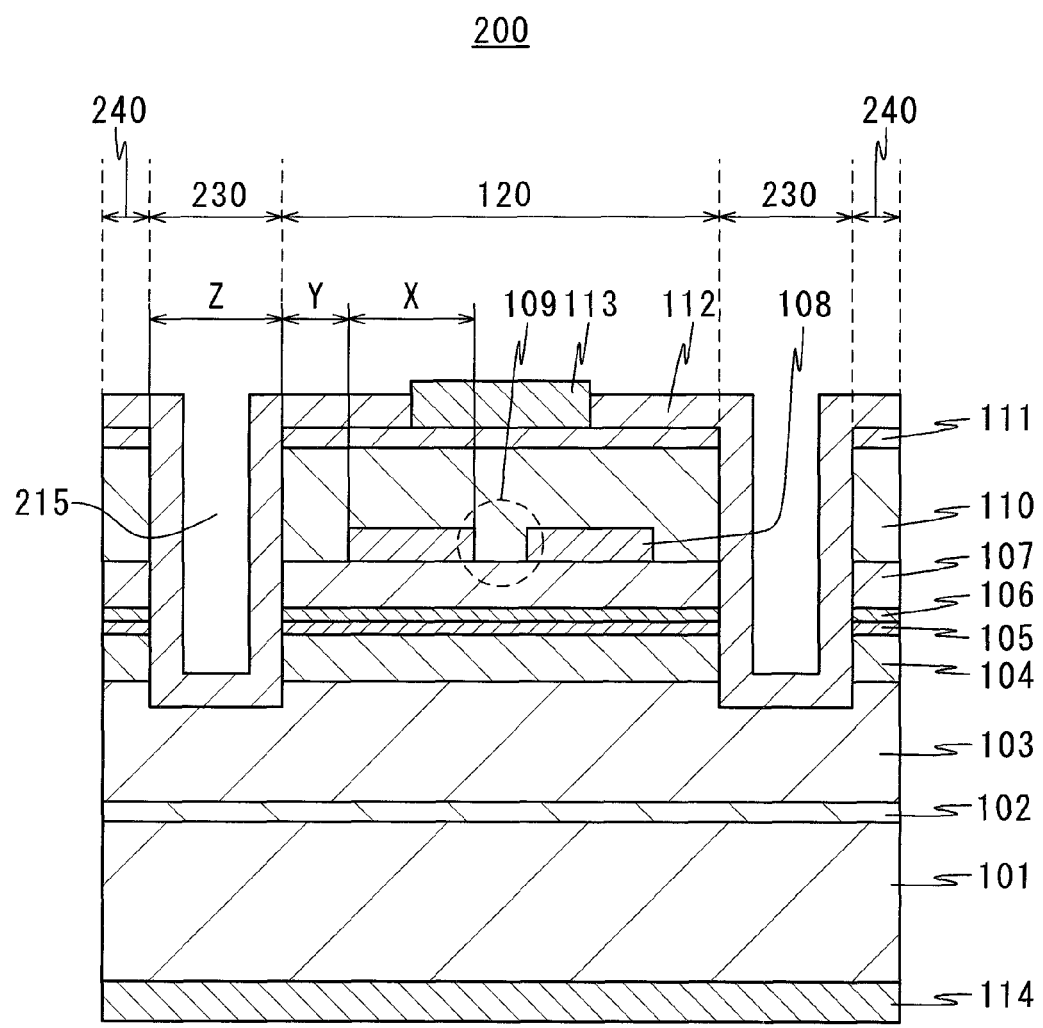
FIG. 5 is a sectional view schematically showing a configuration of a semiconductor light-emitting device 200 according to a second exemplary embodiment.

Next, a semiconductor light-emitting device 200 according to a second exemplary embodiment of the present invention will be described. FIG. 5 is a sectional view schematically showing the configuration of the semiconductor light-emitting device 200 according to the second exemplary embodiment. Unlike the grooves 115 of the semiconductor light-emitting device 100, grooves 215 of the semiconductor light-emitting device 200 are each formed in a trench shape. Accordingly, the mesa portion 120 of the semiconductor light-emitting device 200 is sandwiched between a pair of grooves 215 (that is, groove portions 230). Each groove portion 230 has a finite width Z. Therefore, planarized portions 240 are formed at positions opposed to the mesa portion 120 with the groove portions 230 interposed therebetween. That is, the semiconductor light-emitting device 200 includes the mesa portion 120, a pair of groove portions 230, and a pair of planarized portions 240.

Figure 6:
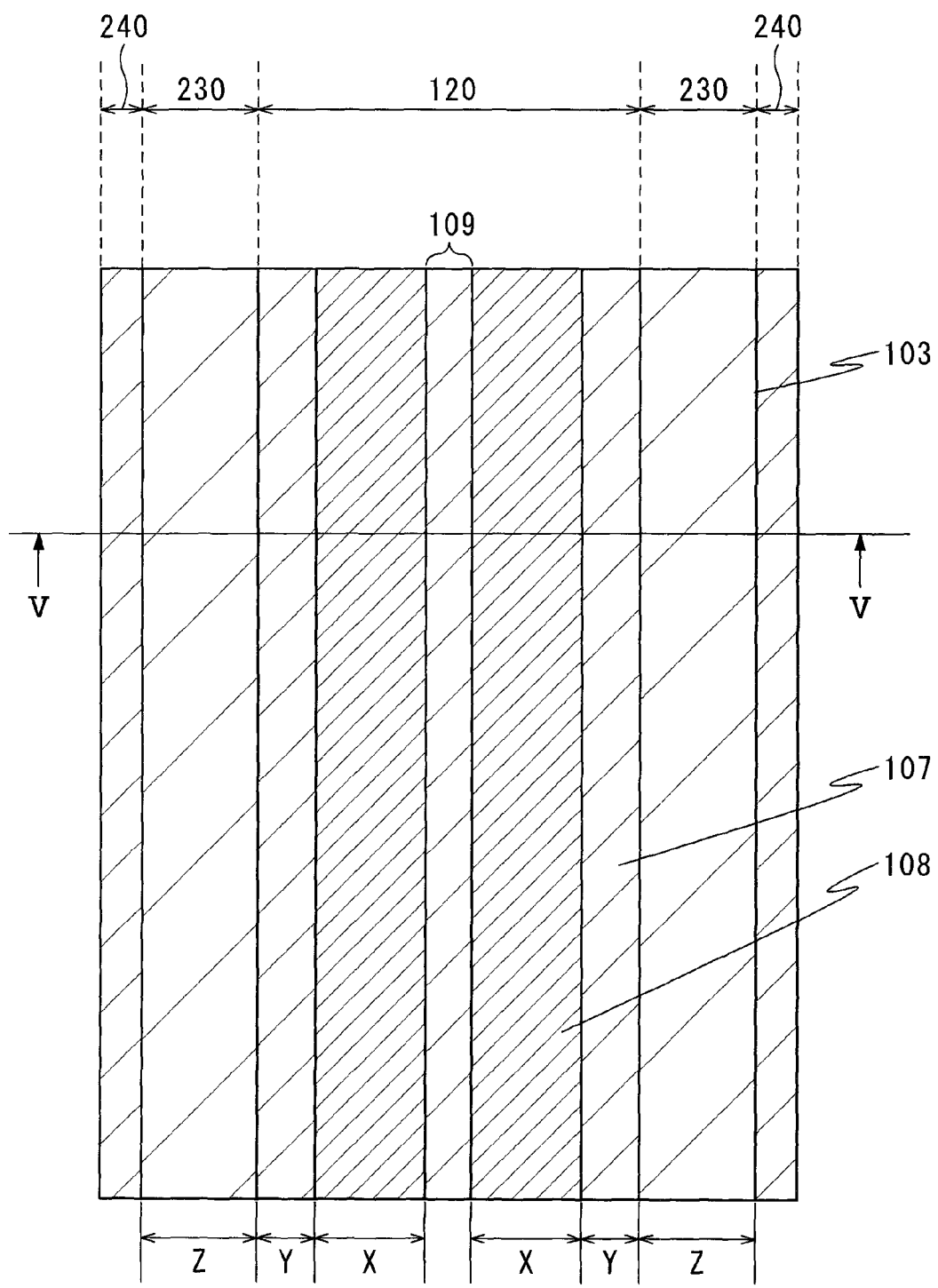
FIG. 6 is a top view schematically showing the configuration of the semiconductor light-emitting device 200 according to the second exemplary embodiment.
Figure 7:
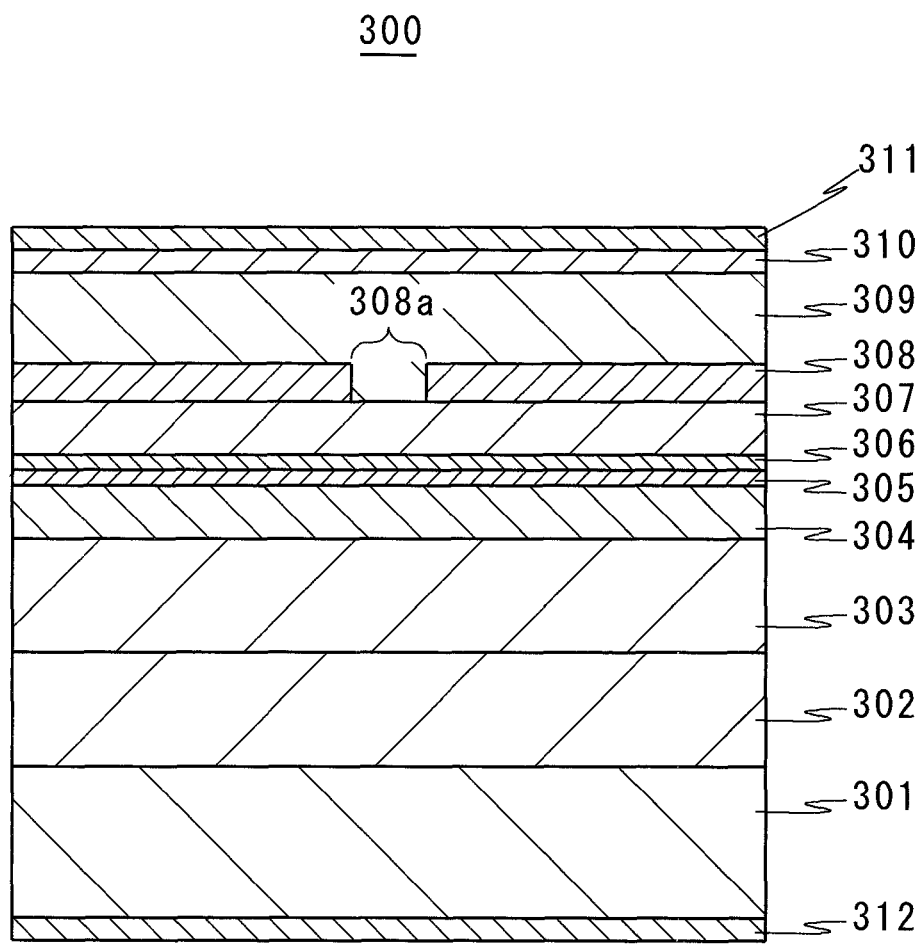
FIG. 7 is a sectional view schematically showing a configuration of a semiconductor laser 300 serving as an inner stripe type nitride semiconductor laser diode disclosed in Japanese Unexamined Patent Application Publication No. 2003-78215.

FIG. 6 is a top view schematically showing the configuration of the semiconductor light-emitting device 200. FIG. 5 is a sectional view taken along the line V-V of FIG. 6. In FIG. 6, the p-type cladding layer 110, the p-type contact layer 111, the protective film 112, and the p-type electrode 113 are omitted to facilitate explanation of the relation among X, Y, and Z in FIG. 5. The other components of the semiconductor light-emitting device 200 are similar to those of the semiconductor light-emitting device 100, so the description thereof is omitted.

Subsequently, a method for manufacturing the semiconductor light-emitting device 200 will be described. In the method for manufacturing the semiconductor light-emitting device 200, the grooves 215 each having the width Z are formed in place of the grooves 115. The other processes of the method for manufacturing the semiconductor light-emitting device 200 are the same as those of the method for manufacturing the semiconductor light-emitting device 100, so the description thereof is omitted.

Like the semiconductor light-emitting device 100, the semiconductor light-emitting device 200 has a configuration in which the current block layer 108 and the grooves 215 are sufficiently away from each other. Therefore, occurrence of a defect introduced during formation of the grooves 215 can be suppressed.

Furthermore, by limiting the width of each groove 215 to Z, break lines used for device isolation, for example, can be formed in the planarized portions 240. This enables more stable device isolation.

Note that the present invention is not limited to the above exemplary embodiments, but can be modified in various manners without departing from the scope of the invention. For example, the composition of each current block layer is not limited to AlN. The current block layer may be made of AlGaN with an Al composition higher than that of the average Al composition of the p-type cladding layer.

The semiconductor light-emitting device 200 has a configuration in which a pair of grooves 215 is formed, but may have a configuration in which a plurality of pairs of groove portions are formed. The width of each band-like groove 115 need not be uniform, but may be varied stepwise.

Furthermore, a region in which the current block layers and the groove portions contact each other may be present in a part of the region of the device. With reference to FIG. 3, when the region in which the current block layer and the groove portions contact each other is set to be equal to or less than 10%, the defect occurrence frequency can be set to about 5%, thereby obtaining a semiconductor light-emitting device having stable characteristics.

The element composition and thickness of the semiconductor layers in the above exemplary embodiments, that is, the n-type substrate 101, the n-type buffer layer 102, the n-type cladding layer 103, the n-side optical confinement layer 104, the active layer 105, cap layer 106, the p-side optical confinement layer 107, the current block layers 108, the p-type cladding layer 110, and the p-type contact layer 111, are illustrative only. Accordingly, the element composition can be changed as needed as long as the present invention functions as a semiconductor light-emitting device and the operation and effect of the present invention can be achieved.

The above exemplary embodiments illustrate the example in which Si is used as an n-type impurity and Mg is used as a p-type impurity, but these impurities are illustrative only. Therefore, other types of dopant may be used as long as the present invention functions as a semiconductor light-emitting device and the operation and effect of the present invention can be achieved.

Moreover, the conductivity types of the n-type substrate 101, the n-type buffer layer 102, the n-type cladding layer 103, the n-side optical confinement layer 104, the p-side optical confinement layer 107, the p-type cladding layer 110, and the p-type contact layer 111 are illustrative only. Accordingly, the conductivity types may be replaced as needed. Specifically, the p-type and the n-type may be reversed.

While the semiconductor laser has been described by way of example in the above exemplary embodiments, the present invention is not limited to the semiconductor laser. The present invention can be applied to the overall field of semiconductor light-emitting devices.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor light-emitting device comprising:
a first cladding layer formed above a substrate of a first conductivity type;
an active layer formed above the first cladding layer;
an optical confinement layer formed above the active layer and having a second conductivity type different from the first conductivity type;
a pair of band-like current block layers formed above the optical confinement layer, the current block layers being opposed to each other through an opening extending in a first direction;
a second cladding layer of the second conductivity type formed on the current block layers and the optical confinement layer exposed with the current block layers not formed;
a contact layer of the second conductivity type formed above the second cladding layer;
a mesa portion sandwiched between a pair of groove portions penetrating at least the active layer from the contact layer and extending in the first direction, and the current block layers and the opening are included in the mesa portion, the mesa portion having a value X corresponding to a width of each current block layer extending in a second direction orthogonal to the first direction at an upper surface of the optical confinement layer, the mesa portion also having a value Y corresponding to a distance from an end of each current block layer on an opposite side to the opening to a side wall of the mesa portion defined by a side wall of the optical confinement layer in the second direction orthogonal to the first direction at an upper surface of the optical confinement layer, and Y is greater than 5 μm.

2. The semiconductor light-emitting device according to claim 1, wherein Y is 10 μm.

3. The semiconductor light-emitting device according to claim 1, wherein Y is 20 μm.

4. The semiconductor light-emitting device according to claim 1, wherein a bottom portion of each of the groove portions is positioned within the first cladding layer.

5. The semiconductor light-emitting device according to claim 1, wherein each of the groove portions is formed in a range from a side wall of the mesa portion to an end of the semiconductor light-emitting device in the second direction.

6. The semiconductor light-emitting device according to claim 1, wherein a first side wall of each of the groove portions corresponds to a side wall of the mesa portion, and a second side wall opposed to the first side wall in the second direction is present on a side closer to the mesa portion than an end of the semiconductor light-emitting device in the second direction.

7. The semiconductor light-emitting device according to claim 1, wherein the substrate, the first cladding layer, the active layer, the optical confinement layer, the second cladding layer, and the contact layer are each made of a nitride semiconductor.

8. The semiconductor light-emitting device according to claim 7, wherein the current block layers are each made of one of AlGaN and AlN.

9. The semiconductor light-emitting device according to claim 7, wherein the optical confinement layer is made of GaN.

10. The semiconductor light-emitting device according to claim 7, wherein the substrate is made of GaN, the first cladding layer is made of AlGaN, and the contact layer is made of GaN.

11. The semiconductor light-emitting device according to claim 7, wherein the active layer has a multiple quantum well structure including a well layer made of InGaN and a barrier layer made of InGaN.

12. The semiconductor light-emitting device according to claim 7, wherein the second cladding layer has a superlattice structure in which a first semiconductor layer made of GaN and a second semiconductor layer made of AlGaN are repeatedly formed.

13. A semiconductor light-emitting device comprising:
a first cladding layer formed above a substrate of a first conductivity type;
an active layer formed above the first cladding layer;
an optical confinement layer formed above the active layer and having a second conductivity type different from the first conductivity type;

a pair of band-like current block layers formed above the optical confinement layer, the current block layers being opposed to each other through an opening extending in a first direction;

a second cladding layer of the second conductivity type formed on the current block layers and the optical confinement layer exposed with the current block layers not formed;

a contact layer of the second conductivity type formed above the second cladding layer;

a mesa portion sandwiched between a pair of groove portions penetrating at least the active layer from the contact layer and extending in the first direction, and the current block layers and the opening are included in the mesa portion; and an end of each current block layer on an opposite side to the opening to a side wall of the mesa portion defined by a side wall of the optical confinement layer is spaced apart by a predetermined value of 10 μm and greater in a second direction orthogonal to the first direction at an upper surface of the optical confinement layer.

14. The semiconductor light-emitting device according to claim 13, wherein a bottom portion of each of the groove portions is positioned within the first cladding layer.

15. The semiconductor light-emitting device according to claim 13, wherein each of the groove portions is formed in a range from a side wall of the mesa portion to an end of the semiconductor light-emitting device in the second direction.

16. The semiconductor light-emitting device according to claim 13, wherein a first side wall of each of the groove portions corresponds to a side wall of the mesa portion, and a second side wall opposed to the first side wall in the second direction is present on a side closer to the mesa portion than an end of the semiconductor light-emitting device in the second direction.

17. The semiconductor light-emitting device according to claim 13, wherein the substrate, the first cladding layer, the active layer, the optical confinement layer, the second cladding layer, and the contact layer are each made of a nitride semiconductor.

18. The semiconductor light-emitting device according to claim 17, wherein the current block layers are each made of one of AlGaN and AlN.

19. The semiconductor light-emitting device according to claim 17, wherein the optical confinement layer is made of GaN.

20. A semiconductor light-emitting device comprising:
a first cladding layer formed above a substrate of a first conductivity type;
an active layer formed above the first cladding layer; an optical confinement layer formed above the active layer and having a second conductivity type different from the first conductivity type;
a pair of band-like current block layers formed above the optical confinement layer, the current block layers being opposed to each other through an opening extending in a first direction;
a second cladding layer of the second conductivity type formed on the current block layers and the optical confinement layer exposed with the current block layers not formed;
a contact layer of the second conductivity type formed above the second cladding layer;
a mesa portion sandwiched between a pair of groove portions penetrating at least the active layer from the contact layer and extending in the first direction, a bottom portion of each of the groove portions being positioned within the first cladding layer, and the current block layers and the opening are included in the mesa portion, the mesa portion having a value X corresponding to a width of each current block layer extending in a second direction orthogonal to the first direction at an upper surface of the optical confinement layer, the mesa portion also having a predetermined value Y corresponding to a distance from an end of each current block layer on an opposite side to the opening to a side wall of the mesa portion defined by a side wall of the optical confinement layer in the second direction, and Y is greater than 5 μm.

* * * * *